United States Patent [19]
Byrne et al.

[11] Patent Number: 5,969,938
[45] Date of Patent: *Oct. 19, 1999

[54] MODULAR POWER SUPPLY CHASSIS EMPLOYING A SUSPENDED BUS BAR ASSEMBLY

[75] Inventors: Vincent M. Byrne, Mesquite; Edward C. Fontana, Rockwall, both of Tex.

[73] Assignee: Lucent Technologies Inc., Murray Hill, N.J.

[*] Notice: This patent issued on a continued prosecution application filed under 37 CFR 1.53(d), and is subject to the twenty year patent term provisions of 35 U.S.C. 154(a)(2).

[21] Appl. No.: 08/749,258

[22] Filed: Nov. 15, 1996

[51] Int. Cl.⁶ .................................................. H05K 7/20
[52] U.S. Cl. ........................ 361/678; 361/614; 361/727
[58] Field of Search ................................. 363/141, 142, 363/144; 439/115, 483, 207, 210–214; 307/43, 44, 77, 80, 81, 84–86, 147, 150; 174/68.2, 70 B, 71 B, 72 B, 88 B; 361/608, 611, 614, 622, 624, 634, 637, 643, 652, 648–650, 641, 673, 678, 676, 729, 724, 725, 727

[56] References Cited

U.S. PATENT DOCUMENTS

| | | |
|---|---|---|
| 3,478,299 | 11/1969 | Cinati et al. .............................. 339/64 |
| 3,493,818 | 2/1970 | Paape et al. .............................. 317/122 |
| 4,025,826 | 5/1977 | Wilson .................................... 361/624 |
| 4,077,687 | 3/1978 | Farag .................................... 339/64 M |
| 4,121,276 | 10/1978 | Kovatch .................................. 361/624 |
| 4,180,845 | 12/1979 | Shariff .................................... 361/624 |
| 4,180,846 | 12/1979 | Wilson .................................... 361/643 |
| 4,685,032 | 8/1987 | Blomstedt .............................. 361/624 |
| 5,157,584 | 10/1992 | Rowe ..................................... 361/638 |
| 5,379,184 | 1/1995 | Barraza .................................. 361/727 |
| 5,515,236 | 5/1996 | Nolan et al. ............................. 361/652 |
| 5,532,907 | 7/1996 | Asselta .................................... 361/648 |

*Primary Examiner*—Gerald Tolin

[57] ABSTRACT

A chassis for receiving power supply modules therein, including: (1) a cabinet; (2) an elongated bus bar assembly suspendable within the cabinet from a mount coupled to the cabinet at an end thereof, the bus bar assembly having a pair of conductors, the pair of conductors having terminal connectors associated therewith for receiving output terminals of a power supply module received into the cabinet (3) a shelf, oriented laterally with respect to the bus bar assembly and located proximate the terminal connectors, that supports at least one power supply module received into the cabinet, the bus bar assembly being suspendable to eliminate a need for support of a weight of the bus bar assembly apart from the mount.

18 Claims, 6 Drawing Sheets

MODULAR POWER SUPPLY CHASSIS EMPLOYING A SUSPENDED BUS BAR ASSEMBLY

TECHNICAL FIELD OF THE INVENTION

The present invention is directed, in general, to a modular power supply and, more specifically, to a modular power supply chassis employing a suspended bus bar assembly.

BACKGROUND OF THE INVENTION

It is not uncommon to find a power supply having a plurality of slots for receiving individual power supply modules. The modular architecture provides several advantages, including, an increase in the level of power that may be delivered to a load and an increase in the overall reliability of the power supply by sharing the load requirements among a plurality of redundant power supply modules. Additionally, the modular architecture enhances the flexibility of the power supply by allowing individual modules to be replaced to accommodate changes in the power supply requirements. Finally, the modular architecture provides a robust system whereby untrained personnel can rapidly replace failed modules.

Conventionally, the power supply may employ multiple converters in separate modules that convert an AC or DC input voltage to a DC output voltage. Again, the power supply may employ multiple converters in separate modules to increase the overall capacity and reliability of the power supply. The converters, in such a system, share the load to, among other things, evenly distribute stresses among the separate modules, while providing a regulated output to the load. Also, when a failure occurs in a modular system, it is possible to identify and shut down the failed unit without affecting the other parallel connected units, thereby minimizing the overall effects on the output of the power supply.

Structurally, the modular power supply is housed in a chassis or framework that provides support for shelves that contain the individual power supply modules. The chassis generally includes U-shaped uprights that the shelves and other equipment of the modular power supply are attached to. The chassis further includes compartmentalized rear and side panels formed of sheet metal to cover the power supply modules and other components that make-up the modular power supply. The chassis and panels form an exo-skeletal cabinet for the modular power supply. The chassis is typically a freestanding framework with the panels added for aesthetic and safety purposes. The shelves accommodate multiple power supply modules.

The modular power supply further includes a power distribution system that distributes power to and from the power supply modules therein. For instance, commercially provided AC power derived from the local utility is fed into the power supply modules, converted by the power supply modules (e.g., in this case, the power converter modules) and DC power is provided to a load coupled to the modular power supply via a power bus architecture. The input and output power, therefore, is distributed through the modular power supply by the power distribution system.

The power bus architecture generally includes a plurality of horizontal bus bars couplable to the power supply modules. The horizontal bus bars are typically supported by the horizontal braces of the chassis. The horizontal bus bars are coupled together by a vertical main power bus. In addition to coupling the horizontal bus bars together, the main power bus provides a path for the output power to the load. Therefore, the power bus architecture of the modular power supply includes a plurality of horizontal bus bars and a vertical main power bus.

The construction of the modular power supply occurs according to the following general steps. First, the chassis is constructed providing the structural framework for modular power supply. Second, the power distribution system is coupled to the frame. Third, the power supply modules are evenly placed on trays that are individually loaded into the chassis proximate the horizontal braces. In conjunction with loading the trays into the chassis, the power supply modules are coupled to the AC input and control terminals and to the horizontal bus bars. Finally, the sheet metal panels may be placed about the chassis to complete the modular power supply.

While the present design of the cabinet and power distribution system provides a workable construction for a modular power supply, there are limitations with such designs. The power supply modules dissipate heat in the process of generating or converting power. To promote the safe and efficient operation of the modular power supply, the heat must be removed from within the cabinet. The horizontal bus bars impede the airflow within the chassis. Consequently, powerful fans capable of moving a sufficient quantity of air through the chassis must be provided in connection with the power supply modules.

In combination therewith, the chassis of the modular power supply must be of sufficient depth to provide a channel that facilitates the removal of the exhaust air from the power supply modules. The modular power supply, therefore, occupies a great deal of valuable floor space to accommodate the depth requirements compelled with the use of the horizontal bus bars of the power distribution system. Additionally, the present power bus architectures require added hardware and structural framework to accommodate the power supply modules of the modular power supply.

Accordingly, what is needed in the art is a power distribution system having a simplified power bus architecture that facilitates a reduction of the overall footprint of the modular power supply by minimizing airflow restrictions therethrough.

SUMMARY OF THE INVENTION

To address the above-discussed deficiencies of the prior art, the present invention provides a chassis for receiving power supply modules therein and a modular power supply. The chassis includes: (1) a cabinet; (2) an elongated bus bar assembly suspendable within the cabinet from a mount coupled to the cabinet at an end thereof, the bus bar assembly having a pair of conductors, the pair of conductors having terminal connectors associated therewith for receiving output terminals of a power supply module received into the cabinet (3) a shelf, oriented laterally with respect to the bus bar assembly and located proximate the terminal connectors, that supports at least one power supply module received into the cabinet, the bus bar assembly being suspendable to eliminate a need for support of a weight of the bus bar assembly apart from the mount.

The present invention therefore introduces the concept of suspending or hanging a bus bar assembly within a cabinet to reduce the support that the bus bar assembly would otherwise require were it, for instance, horizontal. This is in distinct contrast to bus bar design concepts found in the prior art, wherein complicated bus bar supports were required to maintain the bus bars in the proper location. Inasmuch as the mount bears substantially all of the weight of the bus bar assembly, ancillary supports are not required. In applications in which such ancillary supports are desired, such supports may be limited to providing support as against lateral displacement of the bus bar assembly. The present invention is applicable to modular power supplies such as modular converters including modular rectifiers (one type of modular converter).

In one embodiment of the present invention, the cabinet includes a power outlet and a control bus interface associated therewith and proximate the terminal connectors, the power outlet capable of mating with and providing electrical power to the power supply module, the control bus capable of mating with and providing control signals to the power supply module, the terminal connectors capable of mating with and receiving electrical power from the power supply module. In an embodiment to be illustrated and described, the power supply module (or rectifier) is installed into the chassis by being pushed rearwardly into the cabinet until it mates with the power outlet, control bus interface and terminal connectors. Mating may be simultaneous or staged, as desired. Removal of the power supply module involves pulling the module from the cabinet or framework.

In one embodiment of the present invention, the bus bar assembly includes a plurality of pairs of conductors and a pair of cross-connecting conductors that electrically couple corresponding conductors of the plurality of pairs of conductors. Some embodiments to be described herein have three pairs, others four. Those skilled in the art should understand, however, that the present invention is in no way limited by the number of conductor pairs provided in a given cabinet or the spacing of the conductor pairs.

In one embodiment of the present invention, the chassis further includes a lateral support member coupling the bus bar assembly and the shelf, the lateral support member limiting a lateral movement of the bus bar assembly relative to the shelf. The lateral support member may be a simple, lightweight structure, as it is not necessary to bear any portion of the weight of the bus bar assembly.

In one embodiment of the present invention, the cabinet includes a rear wall, a rear edge of the shelf being separated from the rear wall to form a passageway, the bus bar assembly passing through the passageway, the passageway providing a path for convective air currents within the cabinet. In the embodiment to be illustrated and described, the passageway provides substantial passive cooling for the power supply modules. An active fan may be located proximate the passageway to stimulate air flow about the power supply modules.

In one embodiment of the present invention, the terminal connectors comprise opposing spring-biased contacts conductively mounted to each of the pair of conductors, the terminal connectors adapted to spread apart resiliently to receive the output terminals of the power supply module. In the embodiment to be illustrated and described, the output terminals of a given power supply module take the form of blades. The spring-biased contacts allow the blades to be inserted into or removed from the terminal connectors and permit the transmission of high currents without requiring further mounting steps, such as positive restraint (bolts, screws, positive engagement or the like). Alternatively, the terminal connectors (e.g., spring-biased contacts) may be associated with the power supply module and the terminal connectors are coupled to a blade of each of the pair of conductors.

In one embodiment of the present invention, an insulating structure separates the pair of conductors and maintains the pair of conductors in a fixed relative relationship. The insulating structure, while not required, allows the pair of conductors to be located closer together than otherwise allowed. The insulating structure further provides structural rigidity to the pair of conductors.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
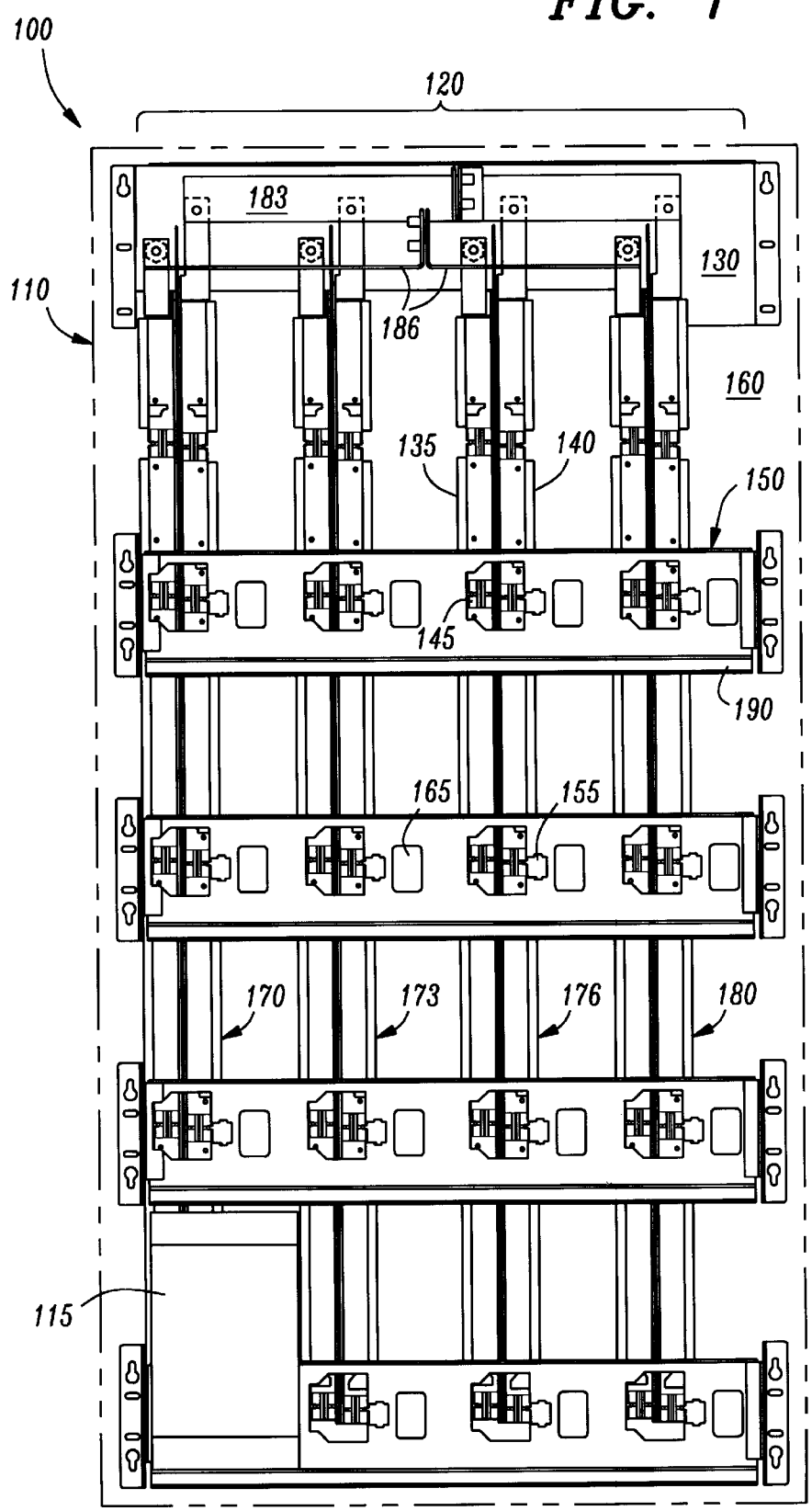
FIG. 1 illustrates a front view of an embodiment of a chassis constructed according to the principles of the present invention.

Referring initially to FIG. 1, illustrated is a front view of an embodiment of a chassis 100 constructed according to the principles of the present invention. The chassis 100 includes a cabinet 110 having compartmentalized panels (not shown) formed of sheet metal to cover the power supply modules (one of which is illustrated and designated 115) and other components that make-up a modular power supply. The chassis 100 also includes an elongated bus bar assembly or bus bar assembly (generally designated 120) suspendable within the cabinet 110 from a mount 130 coupled to the cabinet 110 at an end thereof. The bus bar assembly 120 includes a pair of conductors (one pair of which is referenced as 135, 140) having terminal connectors (one of which is referenced as 145) associated therewith for receiving output terminals (see ensuing FIGUREs) of the power supply modules 115 received into the cabinet 110. The bus bar assembly 120 is suspendable to eliminate a need for support of a weight of the bus bar assembly 120 apart from the mount 130.

The chassis 100 further includes a plurality of shelves (one of which is referenced as 150) oriented laterally with respect to the bus bar assembly 120 and located proximate the terminal connectors 145. The plurality of shelves 150 provide a resting location for the plurality of power supply modules 115 coupled to the terminal connectors 145. The chassis 100 still further includes a central rectifier control system having a plurality of control bus interfaces (one of which is referenced as 155) distributed within the cabinet 110 to allow the central rectifier control system to coordinate the operation of the plurality of power supply modules 115.

The plurality of shelves 150 also include a plurality of power outlets (one of which is referenced as 165) associated therewith and proximate the terminal connectors 145. The plurality of power outlets 165 mate with and provide electrical power to the plurality of power supply modules 115. The terminal connectors 145 mate with and receive converted electrical power from the plurality of power supply modules. Of course, the control bus interfaces 155 and power outlets 165 may be located at other locations within the cabinet 110 such as on a rear wall 160 of the cabinet 110.

In the illustrated embodiment, the bus bar assembly 120, includes four parallel pairs of conductors (a first, second, third and fourth vertical conductor 170, 173, 176, 180) and a pair of cross-connecting conductors (a first and second cross-connecting conductor 183, 186) that electrically couple corresponding conductors of the four parallel pairs of conductors 170, 173, 176, 180. Of course, the present invention is in no way limited by the number of conductor pairs provided in a given cabinet or the spacing of the conductor pairs.

The chassis 100 further includes a plurality of lateral support members (one of which is referenced as 190) that couple the bus bar assembly 120 to the plurality of shelves 150. The plurality of lateral support members 190 limit a lateral movement of the bus bar assembly 120 relative to the plurality of shelves 150. Inasmuch as the mount 130 bears substantially all of the weight of the bus bar assembly 120, ancillary supports (such as the lateral support members 190) are not required.

Figure 2:
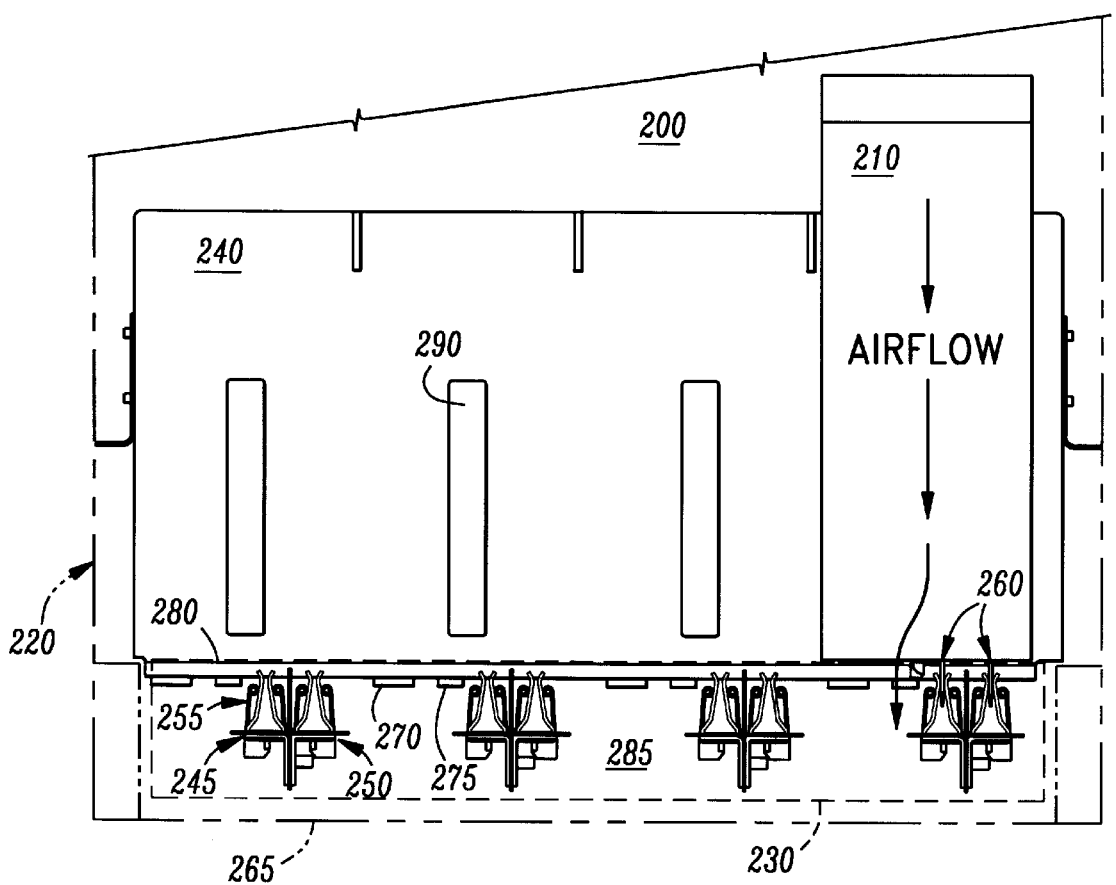
FIG. 2 illustrates a top view of an embodiment of a chassis constructed according to the principles of the present invention.

Turning now to FIG. 2, illustrated is a top view of an embodiment of a chassis 200 constructed according to the principles of the present invention. The chassis 200 receives power supply modules (such as a rectifier 210) therein. Analogous to the chassis 100 of FIG. 1, the chassis 200 includes a cabinet 220, an elongated bus bar assembly (see FIG. 1) suspendable within the cabinet from a mount (not shown) coupled to the cabinet at an end thereof and a shelf 240, oriented laterally with respect to the bus bar assembly, that supports the rectifier 210 received into the cabinet 220. The bus bar assembly includes a pair of conductors (one pair of which is referenced as 245, 250) and terminal connectors (one of which is referenced as 255) associated therewith for receiving output terminals 260 of the rectifier 210 received into the cabinet 220.

The shelf 240 includes power outlets (one of which is referenced as 270) and control bus interfaces (one of which is referenced as 275) associated therewith and proximate the terminal connectors 255. The power outlets 270 mate with and provide electrical power to the rectifier 210 and the control buses 275 mate with and provide control signals to the rectifier 210. The terminal connectors 255 mate with and receive converted electrical power from the rectifier 210. Furthermore, a rear edge 280 of the shelf 240 is separated from a rear wall 265 to form a passageway 285. The bus bar assembly 230 passes through the passageway 285 thereby providing a path for convective air currents within the cabinet 220. The shelf 240 also includes rails (one of which is referenced as 290) for aligning the rectifier 210 thereon.

Typically, the rectifier 210 includes a fan (not shown) to facilitate the convective air currents within the cabinet 220.

Figure 3:
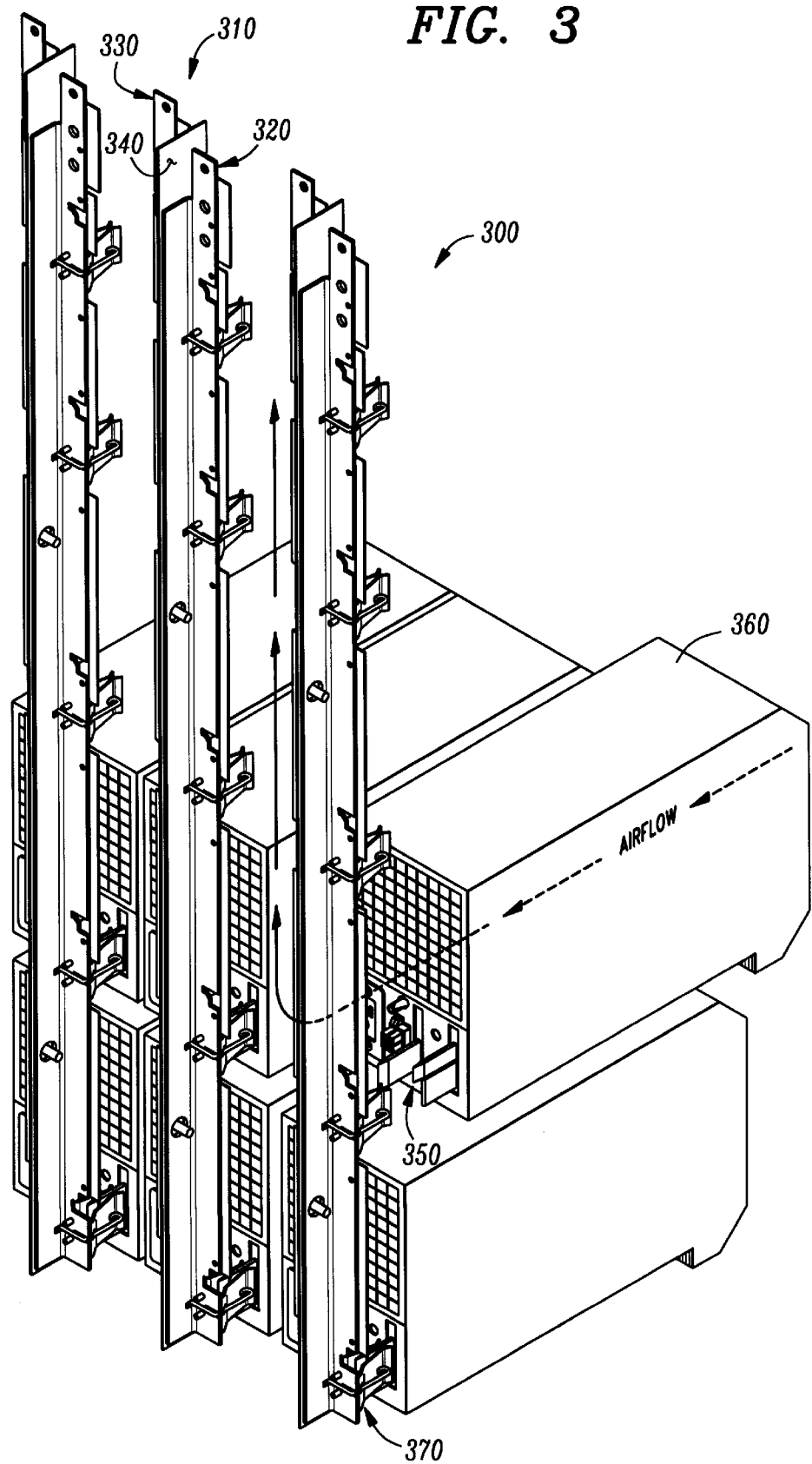
FIG. 3 illustrates an inverse isometric view of an embodiment of three parallel pairs of conductors of a bus bar assembly constructed according to the principles of the present invention.

Turning now to FIG. 3, illustrated is an inverse isometric view of an embodiment of three parallel pairs of conductors (one of which is referenced as 310) of a bus bar assembly 300 constructed according to the principles of the present invention. More specifically, each parallel pair of conductors 310 include a first conductor (one of which is referenced as 320) and second conductor (one of which is referenced as 330). Each parallel pair of conductors 310 also includes an insulating structure (one of which is referenced as 340) separating the first and second conductors 320, 330 and maintaining the first and second conductors 320, 330 in a fixed relative relationship. Output terminals (one of which is referenced as 350) of a plurality of rectifiers (one of which is referenced as 360) are coupled to terminal connectors (one of which as referenced as 370) of the conductors 310. The plurality of rectifiers 360 in conjunction with a cabinet (not shown), bus bar assembly 300, plurality of shelves (not shown) and central rectifier control system (not shown) constitute a modular rectifier. Air flowing through the plurality of rectifiers 360 generally flows from the front to the rear thereof and vertically upward to the top of the bus bar assembly as shown.

Figure 4:
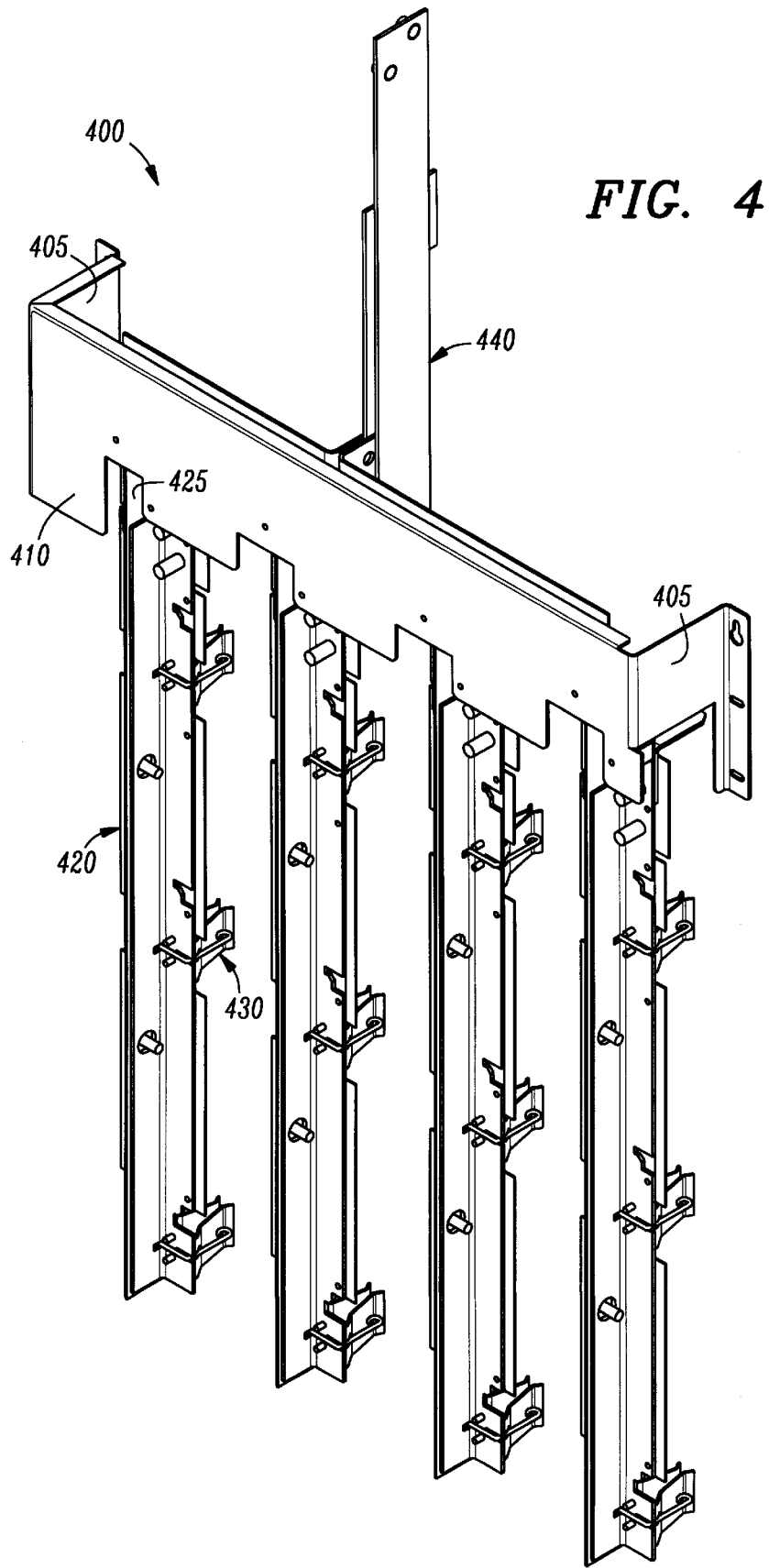
FIG. 4 illustrates an isometric view of an embodiment of a bus bar assembly constructed according to the principles of the present invention.

Turning now to FIG. 4, illustrated is an isometric view of an embodiment of a bus bar assembly 400 constructed according to the principles of the present invention. The bus bar assembly 400 is suspendable within a cabinet of a chassis (not shown) from a mount 410 coupled by mounting legs 405 to the cabinet at an end thereof. The bus bar assembly 400 includes four parallel pairs of conductors (one of which is referenced as 420) and a pair of cross-connecting conductors (not shown) that electrically couple corresponding conductors of the four parallel pairs of conductors 420. The four parallel pair of conductors 420 have terminal connectors (one of which is referenced as 430) associated therewith for receiving output terminals of a power supply module (not shown) received into the cabinet. An insulating structure 425 separates the pair of conductors (see FIG. 5) and maintains the pair of conductors in a fixed relative relationship. The bus bar assembly 400 also includes a main power bus 440 for delivering power to a load coupled thereto.

Figure 5:
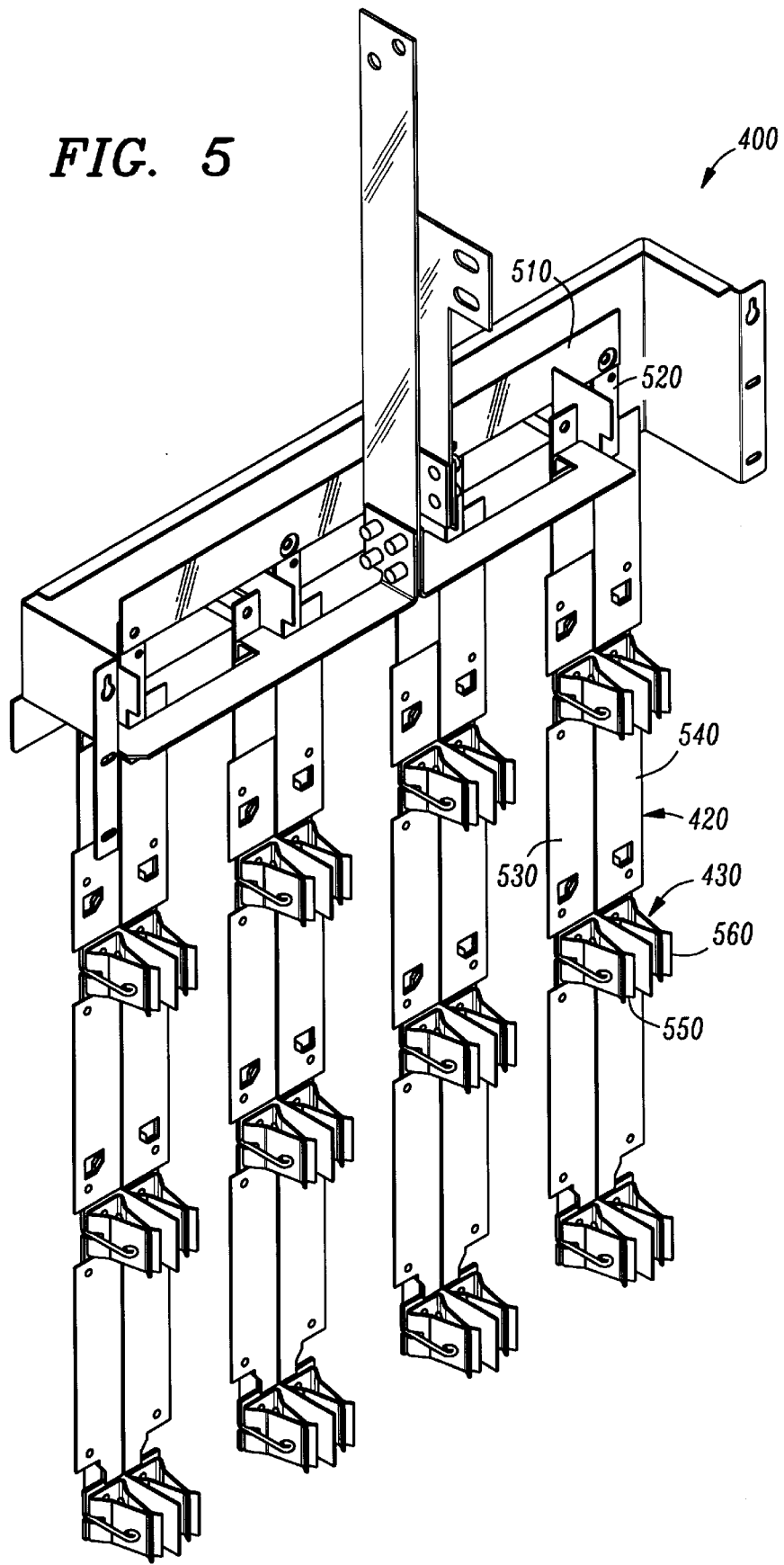
FIG. 5 illustrates an inverse isometric view of the bus bar assembly of FIG. 4.

Turning now to FIG. 5, illustrated is an inverse isometric view of the bus bar assembly 400 of FIG. 4. In addition to the components described with respect to FIG. 4, the inverse view of the bus bar assembly 400 clearly illustrates the pair of cross-connecting conductors 510, 520, the pair of conductors (one pair of which is referenced as 530, 540) that make-up the parallel pairs of conductors 420 and the terminal connectors 430. The terminal connectors 430 include opposing spring-biased contacts (two of which are referenced as 550, 560) conductively mounted to each of the pair of conductors 530, 540, respectively. The terminal connectors 430 are adapted to spread apart resiliently to receive the output terminals of the power supply module.

Figure 6:
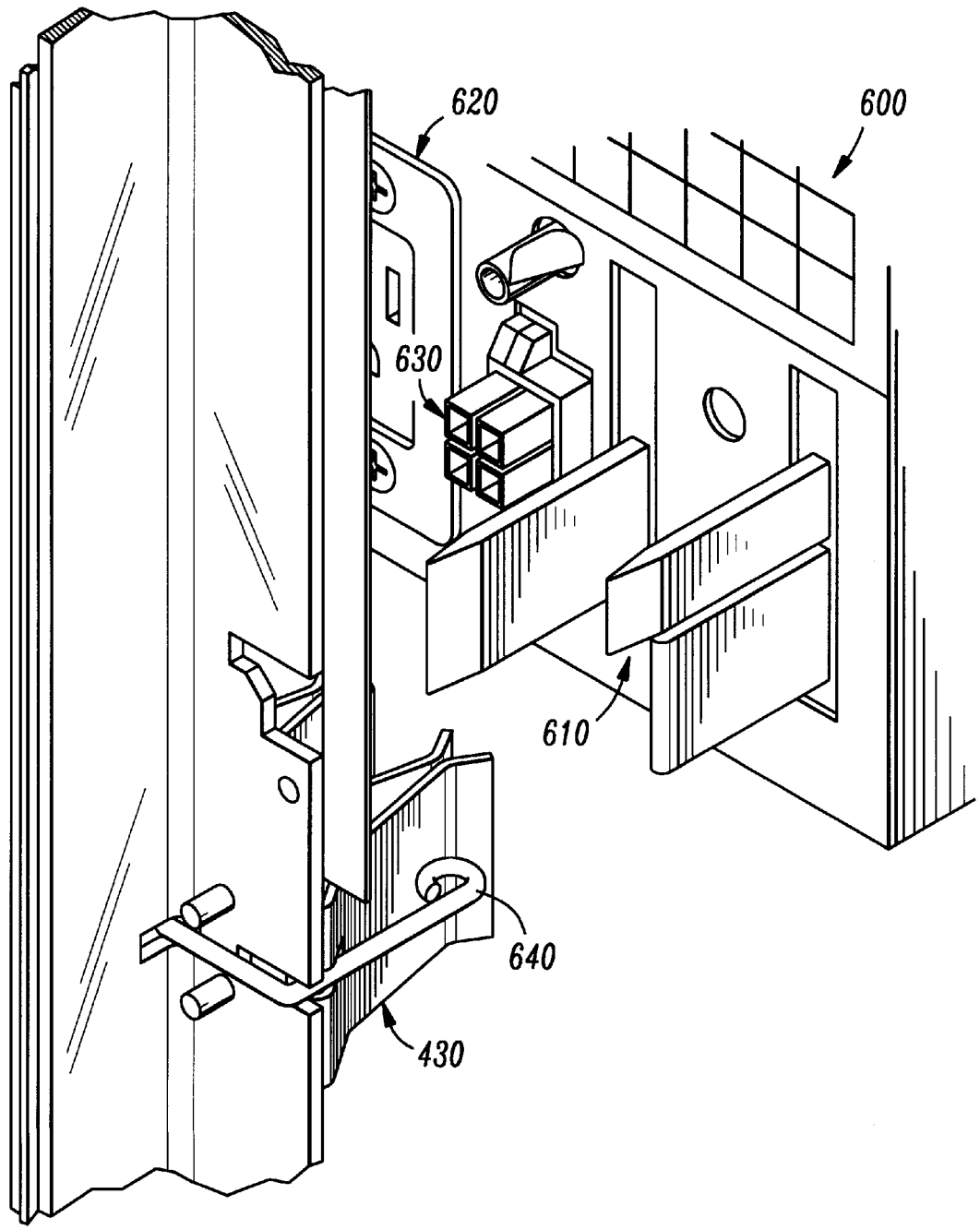
FIG. 6 illustrates a terminal connector of FIGS. 4 and 5 prior to engaging an output terminal of a power supply module.

Turning now to FIG. 6, illustrated is a terminal connector 430 of FIGS. 4 and 5 prior to engaging output terminals 610 of a power supply module 600. The power supply module 600 also includes an input power connector 620, for receiving input power from a power outlet of the chassis (not shown), and a control interface 630, for receiving control signals to control the power supply module 600. A retention clip 640 provides additional compression forces to the opposing spring-biased contacts (see FIG. 5) of the terminal connector 430 thereby enhancing the connectivity between the bus bar assembly (see FIGS. 4 and 5) and the power supply module 600. Additionally, the spring-biased contacts allow the output terminals (e.g., blades) to be inserted into or removed from the terminal connectors 430 and permit the transmission of high currents without requiring further mounting steps, such as positive restraint (bolts, screws, positive engagement or the like). Typically, the power supply module 600 is installed into the chassis by being pushed rearwardly into the cabinet until it mates with the power outlet, control bus interface (not shown) and terminal connector 430.

Although the present invention has been described in detail, those skilled in the art should understand that they can make various changes, substitutions and alterations herein without departing from the spirit and scope of the invention in its broadest form.

What is claimed is:

1. A chassis assembly configured to receive at least one power supply module therein, comprising:
    a cabinet having a side panel and a rear wall;
    a mount having a mounting leg extending therefrom and mounted to said side panel within said cabinet by said mounting leg, said mounting leg separating said mount from said side panel to form a passageway between said side panel and said mount;
    an elongated bus bar assembly coupled to and depending from said mount, said mount supporting a substantial weight of said bus bar assembly to eliminate a need for support of a weight of said bus bar apart from said mount, said elongated bus bar assembly separated from said side panel by said mount to form a vertical passageway between said side panel and said bus bar assembly;
    said bus bar assembly having a pair of conductors, said pair of conductors having terminal connectors associated therewith configured to receive output terminals of at least one power supply module;
    a shelf, oriented laterally with respect to said bus bar assembly and located proximate said terminal connectors, configured to support at least one power supply module,
    said shelf having a rear edge separated from said rear wall to form a passageway, said bus bar assembly passing through said passageway, that provides a path for convective air currents within said cabinet.

2. The chassis assembly as recited in claim 1 wherein said shelf comprises a power outlet and a control bus interface associated therewith and proximate said terminal connectors, said power outlet configured to mate with and provide electrical power to at least one power supply module, said control bus configured to mate with and provide control signals to at least one power supply module, said terminal connectors configured to mate with and receive electrical power from at least one power supply module.

3. The chassis assembly as recited in claim 1 wherein said bus bar assembly comprises a plurality of pairs of conductors and a pair of cross-connecting conductors that electrically couple corresponding conductors of said plurality of pairs of conductors.

4. The chassis assembly as recited in claim 1 further comprising a lateral support member coupling said bus bar assembly and said shelf, said lateral support member limiting a lateral movement of said bus bar assembly relative to said shelf.

5. The chassis assembly as recited in claim 1 wherein said terminal connectors comprise opposing spring-biased contacts conductively mounted to each of said pair of conductors, said terminal connectors adapted to spread apart resiliently to receive output terminals of a power supply module.

6. The chassis assembly as recited in claim 1 wherein an insulating structure separates said pair of conductors and maintains said pair of conductors in a fixed relative relationship.

7. A chassis assembly configured to receive a plurality of rectifier modules therein, comprising:
    a cabinet having an open front face a side panel and a rear wall;
    a mount having a mounting leg extending therefrom and mounted to said side panel within said cabinet by said mounting leg, said mounting leg separating said mount from said side panel to form a passageway between said side panel and said mount;
    an elongated bus bar assembly attached to and depending from said mount, said mount supporting a substantial weight of said bus bar assembly to eliminate a need for support of a weight of said bus bar apart from said mount, said elongated bus bar assembly separated from said side panel by said mount to form a vertical passageway between said side panel and said bus bar assembly;
    said bus bar assembly having a plurality of parallel pairs of conductors, each of said plurality of parallel pairs of conductors being separated by an insulating structure, each of said plurality of parallel pairs of conductors having terminal connectors at a predetermined location along a length thereof for receiving output terminals of a plurality of corresponding rectifier modules;
    a horizontal shelf, located proximate said terminal connectors, configured to support a plurality of rectifier modules,
    said shelf having a rear edge separated from said rear wall to form a passageway, said bus bar assembly passing through said passageway, that provides a path for convective air currents within said cabinet; and
    a lateral member coupling said bus bar assembly and said shelf, said lateral support member limiting a horizontal movement of said bus bar assembly relative to said shelf.

8. The chassis assembly as recited in claim 7 wherein said shelf comprises power outlets and control bus interfaces associated therewith and proximate said terminal connectors of said plurality of parallel pairs of conductors, said power outlets configured to mate with and provide electrical power to a plurality of rectifier modules, said control bus configured to mate with and provide control signals to a plurality of rectifier modules, said terminal connectors configured to mate with and receive rectified electrical power from a plurality of rectifier modules.

9. The chassis as recited in claim 7 wherein said bus bar assembly comprises a pair of cross-connecting conductors that electrically couple corresponding conductors of said plurality of parallel pairs of conductors.

10. The chassis assembly as recited in claim 7 wherein said shelf has a plurality of rails for aligning a plurality of rectifier modules on said shelf.

11. The chassis assembly as recited in claim 7 wherein said terminal connectors comprise opposing spring-biased contacts conductively mounted to each of said plurality of parallel pairs of conductors, said terminal connectors adapted to spread apart resiliently to receive output terminals of a plurality of rectifier modules.

12. The chassis assembly as recited in claim 7 further comprising a central rectifier control system having a plurality of control bus interfaces distributed within said cabinet to allow said central rectifier control system to coordinate an operation of a plurality of rectifier modules coupled thereto.

13. A modular rectifier, comprising:

a cabinet having a side panel and a rear wall;

a mount having a mounting leg extending from said mount and mounted to said side panel within said cabinet by said mounting leg, said mounting leg separating said mount from said side panel to form a passageway between said side panel and said mount;

an elongated bus bar assembly attached to and depending from said mount, said mount supporting a substantial weight of said bus bar assembly to eliminate a need for support of a weight of said bus bar apart from said mount, said elongated bus bar assembly separated from said side panel by said mount to form a vertical passageway between said side panel and said bus bar assembly;

said bus bar assembly having a pair of conductors, said pair of conductors having terminal connectors associated therewith receiving output terminals of rectifier modules received into said cabinet;

a plurality of shelves, oriented laterally with respect to said bus bar assembly and located proximate said terminal connectors;

the rear edge of each of said plurality of shelves being separated from said rear wall to form a passageway, said bus bar assembly passing through said passageway, said passageway providing a path for convective air currents within said cabinet;

a plurality of rectifier modules resting on said plurality of shelves and coupled to said terminal connectors; and a central rectifier control system having a plurality of control bus interfaces distributed within said cabinet to allow said central rectifier control system to coordinate an operation of said plurality of rectifier modules.

14. The rectifier as recited in claim 13 wherein said plurality of shelves comprise power outlets associated therewith and proximate said terminal connectors, said plurality of power outlets mating with and providing electrical power to said plurality of rectifier modules, said terminal connectors mating with and receiving rectified electrical power from said plurality of rectifier modules.

15. The rectifier as recited in claim 13 wherein said bus bar assembly comprises a plurality of parallel pairs of conductors and a pair of cross-connecting conductors that electrically couple corresponding conductors of said plurality of parallel pairs of conductors.

16. The rectifier as recited in claim 13 further comprising a plurality of lateral support members coupling said bus bar assembly and said plurality of shelves, said plurality of lateral support members limiting a lateral movement of said bus bar assembly relative to said plurality of shelves.

17. The rectifier as recited in claim 13 wherein said terminal connectors comprise opposing spring-biased contacts conductively mounted to each of said pair of conductors, said terminal connectors adapted to spread apart resiliently to receive said output terminals of said plurality of rectifier modules.

18. The rectifier as recited in claim 13 wherein an insulating structure separates said pair of conductors and maintains said pair of conductors in a fixed relative relationship.

* * * * *